(12) United States Patent
Hikita et al.

(10) Patent No.: US 6,232,668 B1
(45) Date of Patent: May 15, 2001

(54) SEMICONDUCTOR DEVICE OF CHIP-ON-CHIP STRUCTURE AND SEMICONDUCTOR CHIP FOR USE THEREIN

(75) Inventors: Junichi Hikita; Hiroo Mochida, both of Kyoto (JP)

(73) Assignee: Rohm Co. Ltd. (JP)

( * ) Notice: Subject to any disclaimer, the term of this patent is extended or adjusted under 35 U.S.C. 154(b) by 0 days.

(21) Appl. No.: 09/493,250

(22) Filed: Jan. 28, 2000

(30) Foreign Application Priority Data

Feb. 2, 1999 (JP) ............................................. 11-25462

(51) Int. Cl.[7] ........................... H01L 23/48; H01L 23/52; H01L 29/40
(52) U.S. Cl. ........................... 257/777; 257/778; 257/686; 257/723; 257/784; 257/737; 257/738; 257/780; 257/659; 257/660; 257/690; 257/691; 257/685
(58) Field of Search ..................................... 257/777, 778, 257/686, 723, 784, 734, 690, 691, 725, 659, 660

(56) References Cited

U.S. PATENT DOCUMENTS 5,677,575 * 10/1997 Maeta et al. ........................ 257/778
5,757,078 * 5/1998 Matsuda et al. ..................... 257/737
5,821,625 * 10/1998 Yoshida et al. ...................... 257/777
5,869,903 * 2/1999 Nakatani et al. .................... 257/777

FOREIGN PATENT DOCUMENTS

359043553 * 3/1984 (JP) .......................................... 21/92
403011739 * 1/1991 (JP) ....................................... 21/321

* cited by examiner

*Primary Examiner*—Steven Loke
*Assistant Examiner*—Nitin Parekh
(74) *Attorney, Agent, or Firm*—Rader, Fishman & Grauer

(57) ABSTRACT

A semiconductor chip for use in a semiconductor device of chip-on-chip structure in which a second semiconductor chip is stacked on the semiconductor chip and bonded to a surface of the semiconductor chip. The semiconductor chip includes: chip interconnection portions provided on the surface of the semiconductor chip for electrical connection to the second semiconductor chip; and a shielding conductive portion surrounding the chip interconnection portions and connected to a low impedance portion. The chip interconnection portions may be generally evenly arranged in a bonding surface area of the semiconductor chip onto which the second semiconductor chip is bonded.

18 Claims, 3 Drawing Sheets

SEMICONDUCTOR DEVICE OF CHIP-ON-CHIP STRUCTURE AND SEMICONDUCTOR CHIP FOR USE THEREIN

BACKGROUND OF THE INVENTION

1. Field of the Invention

The present invention relates to a semiconductor device of chip-on-chip structure in which semiconductor chips are bonded to each other in a stacked relation, and to a semiconductor chip for use in such a semiconductor device.

2. Description of Related Art

Semiconductor devices of chip-on-chip structure have been proposed, in which a pair of semiconductor chips are disposed in an opposed relation and electrically connected to each other via bumps. However, the semiconductor devices have many problems to be solved for practical applications.

The chip-on-chip structure is expected to reduce the areas of wiring boards to be incorporated in various electronic systems for size reduction of these systems, as compared with a case where the chips are individually packaged in single-chip packages. For electronic systems such as mobile phones which handle high frequency signals, however, it is important to take protective measures against noises, so that a shielding member should additionally be provided for shielding the entire wiring board. Therefore, it is impossible to achieve drastic size reduction of the systems simply by employing the chip-on-chip structure.

SUMMARY OF THE INVENTION

It is an object of the present invention to provide a semiconductor device of chip-on-chip structure with an effective anti-noise consideration, and a semiconductor chip for use in such a semiconductor device.

The semiconductor chip according to the present invention for use in a semiconductor device of chip-on-chip structure in which a second semiconductor chip is stacked on the semiconductor chip and bonded to a surface of the semiconductor chip comprises: chip interconnection portions provided on the surface of the semiconductor chip for electrical connection to the second semiconductor chip; and a shielding conductive portion provided on the surface of the semiconductor chip as surrounding the chip interconnection portions, and connected to a low impedance portion.

With this arrangement, the shielding conductive portion surrounds the chip interconnection portions on the surface of the semiconductor chip, thereby preventing external noises from reaching the chip interconnection portions. Where the semiconductor device of chip-on-chip structure is produced by bonding the second semiconductor chip onto the semiconductor chip in a stacked relation, there is no need to additionally provide a noise shielding mechanism.

Further, the respective semiconductor chips are supported by the shielding conductive portion, whereby stresses exerted on the semiconductor chips by resin sealing can be distributed therethrough. Therefore, deformation of the semiconductor chips can be prevented which may otherwise occur due to a mechanical pressure and a stress/strain. Thus, the semiconductor device of chip-on-chip structure can have stable device characteristic properties.

Particularly, where the chip interconnection portions are generally evenly arranged in a bonding surface area of the semiconductor chip onto which the second semiconductor chip is bonded, the deformation of the semiconductor chip due to the mechanical pressure and the stress/strain can more effectively be prevented.

The chip interconnection portions and the shielding conductive portion may be comprised of metal protuberances formed on the surface of the semiconductor chip. The metal protuberances may be so-called bumps which are formed, for example, by metal plating, or metal deposition films which have a height smaller than the bumps.

The chip interconnection portions and the shielding conductive portion are preferably composed of the same material.

With this arrangement, the chip interconnection portions and the shielding conductive portion can be formed in a single process step, so that the production process is simplified.

The semiconductor device of the present invention, which includes a first semiconductor chip and a second semiconductor chip stacked on the first semiconductor chip and bonded onto a surface of the first semiconductor chip, comprises: chip interconnection portions provided between opposed surfaces of the first and second semiconductor chips for electrical connection between the first semiconductor chip and second semiconductor chip; and a shielding conductive portion provided between the opposed surfaces of the first and second semiconductor chips as surrounding the chip interconnection portions, and connected to a low impedance portion.

The foregoing and other objects, features and effects of the present invention will become more apparent from the following description of the preferred embodiments with reference to the attached drawings.

DESCRIPTION OF THE PREFERRED EMBODIMENTS

Figure 1:
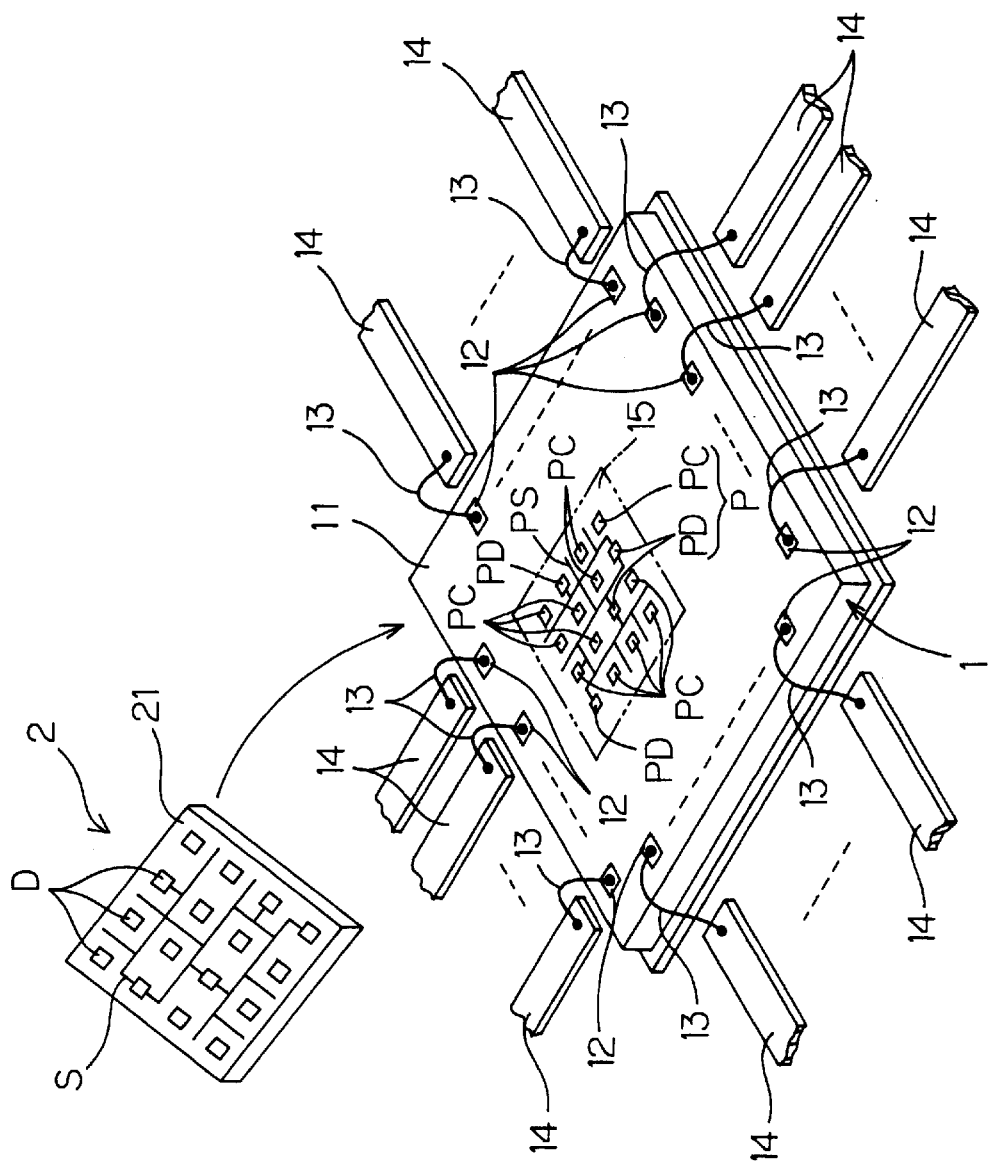
FIG. 1 is an exploded perspective view of a semiconductor device according to one embodiment of the present invention.

FIG. 1 is an exploded perspective view of a semiconductor device according to one embodiment of the present invention. The semiconductor device has a so-called chip-on-chip structure, which includes a mother chip or primary chip 1 as the first semiconductor chip, and a daughter chip or secondary chip 2 as the second semiconductor chip stacked on the primary chip 1 and bonded to a surface 11 of the primary chip 1.

The primary chip 1 is comprised, for example, of a silicon chip. The surface 11 is a semiconductor substrate surface of the primary chip 1 on the side of an active surface region formed with functional devices such as transistors, and covered with a protective film of an insulative material. A plurality of pads 12 for external connection are provided in a peripheral portion of the surface 11 of the primary chip 1 of a generally rectangular plan shape as exposed from the protective film. The external connection pads 12 are to be connected to a lead frame 14 via bonding wires 13. The primary chip 1 has a bonding region 15 for connection to the secondary chip 2 in an inward surface portion of the primary chip 1. A plurality of pads P for internal connection to the secondary chip 2 are provided in the bonding region 15.

The secondary chip 2 is bonded to the primary chip 1 with its surface 21 opposed to the surface 11 of the primary chip 1 by a so-called face-down bonding. The secondary chip 2 is comprised, for example, of a silicon chip. The surface 21 is a semiconductor substrate surface of the secondary chip 2 on the side of an active surface region formed with devices such as transistors, and usually covered with a protective film of an insulative material.

Figure 2:
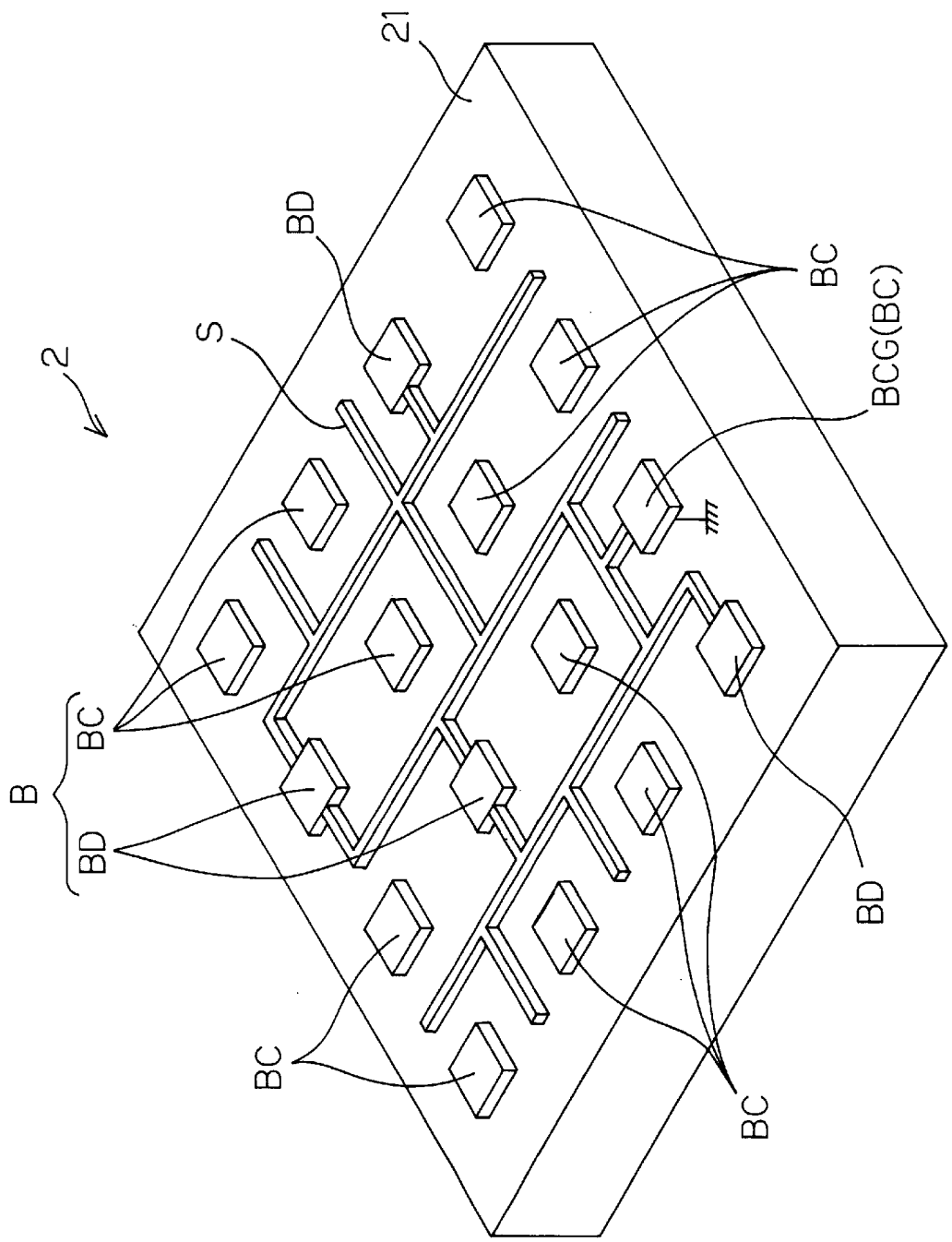
FIG. 2 is a perspective view illustrating the construction of a secondary chip on a greater scale.

FIG. 2 is a perspective view illustrating the construction of the secondary chip 2 on a greater scale. Bumps B of an oxidation-resistant metal such as gold, lead, platinum, silver or iridium are provided on the surface 21 of the protective film of the secondary chip 2 as projecting from the surface 21.

The bumps B include chip interconnection bumps BC (chip interconnection portions) for electrical connection to circuitry formed in the primary chip 1, and dummy bumps BD which do not serve for electrical connection to the circuitry of the primary chip 1.. The chip interconnection bumps BC are generally evenly arranged on the surface 21 which is to face the primary chip 1. The positions of the dummy dumps BD are determined so that the plurality of bumps Bare generally evenly arranged on the surface of the secondary chip 2. That is, the dummy bumps BD are disposed in areas where the interconnection bumps BC are not disposed.

Wall-like shielding interconnection pattern S is provided on the surface 21 as protruding therefrom and surrounding the respective interconnection bumps BC. The shielding interconnection pattern S is connected to the dummy bumps BD and to a grounded bump BCG (low impedance portion) of the interconnection bumps BC. The shielding interconnection pattern S together with the dummy bumps BD surround the respective interconnection bumps BC to form the shielding conductive portion. The shielding interconnection pattern S is composed of the same material as the bumps B, so that the formation of the shielding interconnection pattern S is achieved simultaneously with the formation of the bumps B in a production process. It is also possible to form the shielding interconnection pattern S from a material different from the material for the bumps B. In this case, the shielding interconnection pattern S is formed in a process step separate from the bump B formation step.

As shown in FIG. 1, pads P are provided on the surface of the primary chip 1 in positions corresponding to the positions of the bumps B. A pad pattern PS corresponding to the shielding interconnection pattern S is provided on the surface of the primary chip 1. Pads PC out of the pads P which are provided in positions corresponding to the positions of the interconnection bumps BC are connected to internal circuitry in the primary chip 1. On the other hand, the pads PD which are provided in positions corresponding to the positions of the dummy bumps BD are isolated from the internal circuitry. The pad pattern PS corresponding to the shielding interconnection pattern S is also electrically isolated from the internal circuitry.

Figure 3:
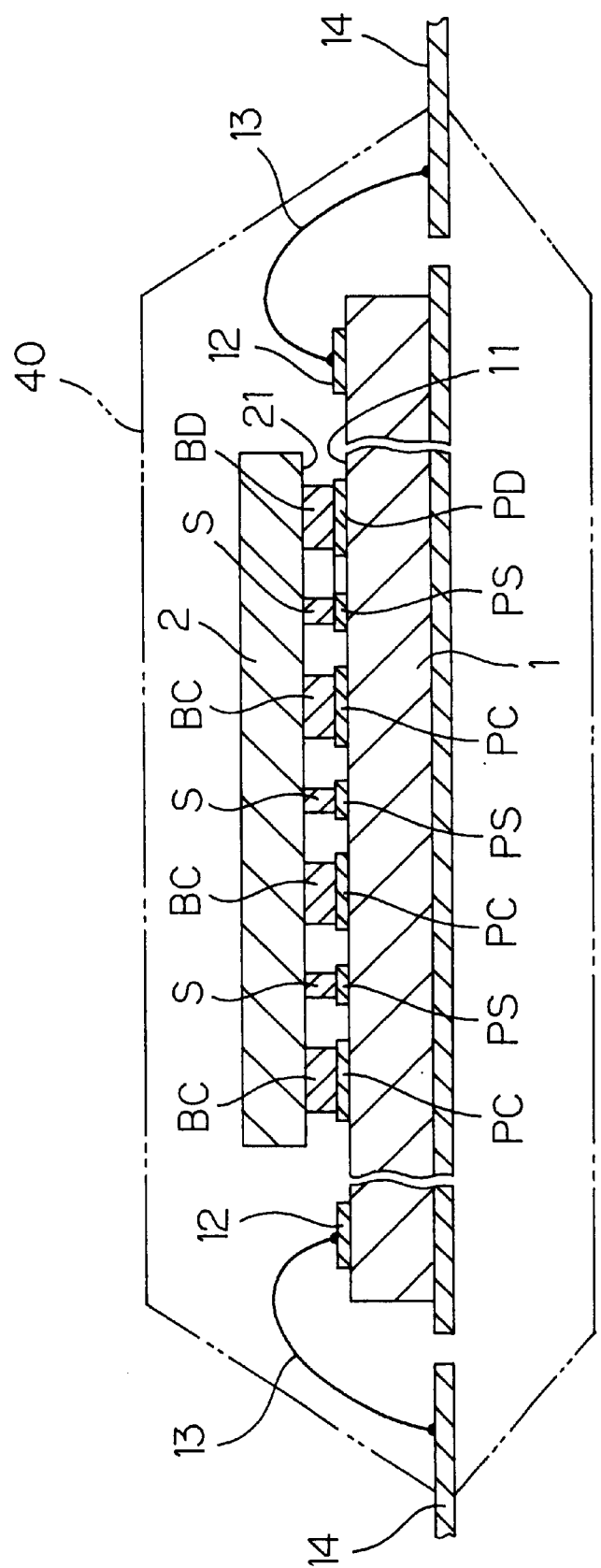
FIG. 3 is a schematic sectional view illustrating a primary chip and the secondary chip bonded to each other.

FIG. 3 is a schematic sectional view illustrating the primary chip 1 and the secondary chip 2 bonded to each other. The primary chip 1 and the secondary chip 2 are press-bonded to each other with the surfaces 11 and 21 thereof being opposed to each other. At this time, ultrasonic vibrations are applied to the primary chip 1 and/or the secondary chip 2, as required. Thus, the bumps B and the shielding interconnection pattern S are respectively bonded to the pads P and the pad pattern PS, whereby the primary chip 1 and the secondary chip 2 are integrated into the chip-on-chip structure. In this state, the interconnection bumps BC bonded to the interconnection pads PC are surrounded by the shielding conductive portion including the dummy bumps BD and the shielding interconnection pattern S respectively bonded to the pads PD and the pad pattern PS. Since the shielding conductive portion is grounded, the interconnection bumps BC and the pads PC bonded to each other are shielded from external noises.

In addition, the bumps B are generally evenly arranged on the secondary chip 2 and the shielding interconnection pattern S is interposed between the primary chip 1 and the secondary chip 2 as surrounding the interconnection pads PC. Therefore, where the semiconductor device of chip-on-chip structure in which the primary chip 1 and the secondary chip 2 are bonded to each other is resin-sealed to be packaged in a single package 40, the deformation of the primary chip 1 or the secondary chip 2 due to the stress/strain can be prevented, so that devices incorporated in these chips are free from deterioration in characteristic properties thereof.

In accordance with this embodiment, the semiconductor device is sufficiently resistant to the mechanical pressure and stress due to the resin sealing, and incorporates therein an effective noise shielding structure. With the use of the semiconductor device, there is no need to provide an additional larger-size shielding mechanism in an electronic system such as a mobile phone, so that the size of the electronic system can be reduced.

While one embodiment of the present invention has thus been described, the invention can be embodied in any other way. Although the shielding interconnection pattern S is connected to the ground in the embodiment described above, the shielding interconnection pattern S may be connected to a power line (low impedance portion).

In the aforesaid embodiment, the secondary chip 2 is provided with the bumps B. Similarly, the primary chip 1 may be provided with bumps. The bonding between the primary chip 1 and the secondary chip 2 on a chip-on-chip basis may be achieved by bonding the bumps provided on the primary chip 1 and on the secondary chip 2.

Similarly, a wall-like shielding interconnection pattern may be provided on the primary chip 1 as protruding from the surface 11 thereof. The shielding interconnection patterns provided on the primary chip 1 and on the secondary chip 2 may be bonded to each other.

Further, metal deposition films and the like may be employed instead of the metal protuberances (such as the bumps) having a relatively great height. Similarly, the shielding interconnection pattern may be comprised of a metal deposition film having a height smaller than the bumps.

Although an explanation has been given to a case where the single secondary chip 2 is bonded on the surface 11 of the primary chip 1 in the aforesaid embodiment, two or more secondary chips may be bonded on the surface 11 of the primary chip 1.

In the aforesaid embodiment, the primary chip 1 and the secondary chip 2 are each comprised of a silicon chip, but semiconductor chips comprising any other semiconductor materials such as a gallium-arsenide semiconductor and a germanium semiconductor may be employed for the semiconductor device of the present invention. In this case, the semiconductor materials for the first semiconductor chip and for the second semiconductor chip may be either the same or different.

While the present invention has been described in detail by way of the embodiment thereof, it should be understood that the foregoing disclosure is merely illustrative of the technical principles of the present invention but not limitative of the same. The spirit and scope of the present invention are to be limited only by the appended claims.

This application claims priority benefits under 35 USC Section 119 on the basis of Japanese Patent Application No. 11-25462 filed to the Japanese Patent Office on Feb. 2, 1999, the disclosure thereof being incorporated herein by reference.

What is claimed is:

1. A semiconductor chip for use in a semiconductor device of chip-on-chip structure in which a second semiconductor chip is stacked on the semiconductor chip and bonded to a surface of the semiconductor chip, the semiconductor chip comprising:
   chip interconnection portions extending a first height from the surface of the semiconductor chip for electrical connection to the second semiconductor chip; and
   a shielding conductive portion that extends, at a second height that is substantially the same as said first height, from the surface of the semiconductor chip as surrounding the chip interconnection portions, and connected to a low impedance portion.

2. A semiconductor chip as set forth in claim 1, wherein the chip interconnection portions are generally evenly arranged in a bonding surface area of the semiconductor chip onto which the second semiconductor chip is bonded.

3. A semiconductor chip as set forth in claim 1, further comprising dummy bonding portions provided on the surface of the semiconductor chip, the dummy bonding portions not serving for electrical connection to the second semiconductor chip.

4. A semiconductor chip as set forth in claim 3, wherein the chip interconnection portions and the dummy bonding portions include metal protuberances formed on the surface of the semiconductor chip, and the metal protuberances are generally evenly arranged on the surface of the semiconductor chip.

5. A semiconductor chip as set forth in claim 1, wherein the chip interconnection portions and the shielding conductive portion include metal protuberances formed on the surface of the semiconductor chip.

6. A semiconductor chip as set forth in claim 1, wherein the chip interconnection portions and the shielding conductive portion include of the same material.

7. A semiconductor chip as set forth in claim 1, wherein the low impedance portion is at least one of the chip interconnection portions which is connected to the ground.

8. A semiconductor chip as set forth in claim 1, wherein said shielding conductive portion is a noise shielding portion for shielding noise between said chip interconnection portions.

9. A semiconductor chip as set forth in claim 8, wherein said shielding conductive portion is configured as a wall-like shielding interconnection pattern on the surface of said semiconductor chip.

10. A semiconductor device which includes a first semiconductor chip and a second semiconductor chip stacked on the first semiconductor chip and bonded to a surface of the first semiconductor chip, the semiconductor device comprising:
    chip interconnection portions, each having a first height that extends between opposed surfaces of the first and second semiconductor chips, provided between said opposed surfaces for electrical connection between the first semiconductor chip and second semiconductor chip; and
    a shielding conductive portion, having a second height that is substantially the same as said first height, provided between the opposed surfaces of the first and second semiconductor chips as surrounding the chip interconnection portions, and connected to a low impedance portion.

11. A semiconductor device as set forth in claim 10, wherein the chip interconnection portions are generally evenly arranged between the opposed surfaces of the first and second semiconductor chips.

12. A semiconductor device as set forth in claim 10, further comprising dummy bonding portions provided between the first semiconductor chip and the second semiconductor chip, the dummy bonding portions not serving for electrical connection between the first and second semiconductor chips.

13. A semiconductor device as set forth in claim 12, wherein the chip interconnection portions and the dummy bonding portions include metal protuberances formed on at least one of the opposed surfaces of the first and second semiconductor chips, and the metal protuberances are generally evenly arranged between the opposed surfaces of the first and second semiconductor chips.

14. A semiconductor device as set forth in claim 10, wherein the chip interconnection portions and the shielding conductive portion include metal protuberances formed on at least one of the opposed surfaces of the first and second semiconductor chips.

15. A semiconductor device as set forth in claim 10, wherein the chip interconnection portions and the shielding conductive portion are composed of the same material.

16. A semiconductor device as set forth in claim 10, wherein the low impedance portion is at least one of the chip interconnection portions which is connected to the ground.

17. A semiconductor device as set forth in claim 10, wherein said shielding conductive portion is a noise shielding portion for shielding noise between said chip interconnection portions.

18. A semiconductor device as set forth in claim 17, wherein said shielding conductive portion is configured as a wall-like shielding interconnection pattern between the opposed surfaces of the first and second semiconductor chips.

* * * * *